(12) United States Patent
Szelag et al.

(10) Patent No.: US 11,251,326 B2
(45) Date of Patent: Feb. 15, 2022

(54) METHOD OF FABRICATION OF A PHOTONIC CHIP COMPRISING AN SACM-APD PHOTODIODE OPTICALLY COUPLED TO AN INTEGRATED WAVEGUIDE

(71) Applicant: Commissariat a l'Energie Atomique et aux Energies Alternatives, Paris (FR)

(72) Inventors: Bertrand Szelag, Grenoble (FR); Laetitia Adelmini, Grenoble (FR); Stephane Brision, Grenoble (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 20 days.

(21) Appl. No.: 16/832,398

(22) Filed: Mar. 27, 2020

(65) Prior Publication Data
US 2020/0313026 A1 Oct. 1, 2020

(30) Foreign Application Priority Data
Mar. 29, 2019 (FR) ...................... 19 03401

(51) Int. Cl.
*H01L 31/107* (2006.01)
*G02B 6/136* (2006.01)
(Continued)

(52) U.S. Cl.
CPC .......... *H01L 31/1075* (2013.01); *G02B 6/136* (2013.01); *H01L 31/1804* (2013.01);
(Continued)

(58) Field of Classification Search
CPC ............ H01L 31/1075; H01L 31/1804; H01L 31/02161; G02B 6/136; G02B 2006/12061; G02B 2006/12123; Y02P 75/50
(Continued)

(56) References Cited

U.S. PATENT DOCUMENTS 9,728,657 B2 * 8/2017 Joo .................... H01L 31/03529
2014/0291682 A1 * 10/2014 Huang ................ H01L 31/1075
257/55

(Continued)

FOREIGN PATENT DOCUMENTS

JP 2017-147352 A 8/2017

OTHER PUBLICATIONS

French Preliminary Search Report dated December 9, 2019 in French Application 19 03401 filed Mar. 29, 2019 (with English Translation of Categories of Cited Documents), 6 pages.

(Continued)

*Primary Examiner* — Hrayr A Sayadian
(74) *Attorney, Agent, or Firm* — Oblon, McClelland, Maier & Neustadt, L.L.P.

(57) ABSTRACT

The invention relates to a method of fabrication of a photonic chip 1 comprising an avalanche photodiode 20 of the SACM type optically coupled to an integrated waveguide 40, comprising a step for forming a first spacer 24 allowing a constant peripheral recessing $dr_{zc}$ of the charge region 23 to be defined later on with respect to an edge of the multiplication portion 22, then a step for forming a second spacer 26 allowing a constant peripheral recessing $dr_{pa}$ of the absorption portion 27 to be defined later on with respect to an edge of the charge region 23.

13 Claims, 7 Drawing Sheets

(51) Int. Cl.
*H01L 31/18* (2006.01)
*G02B 6/12* (2006.01)

(52) U.S. Cl.
CPC .............. *G02B 2006/12061* (2013.01); *G02B 2006/12123* (2013.01)

(58) Field of Classification Search
USPC .......................................................... 257/186
See application file for complete search history.

(56) References Cited

U.S. PATENT DOCUMENTS

2015/0108327 A1* 4/2015 Huang ............ H01L 31/035281
250/200
2019/0019903 A1* 1/2019 Ye ........................ H01L 31/105

OTHER PUBLICATIONS

Huang, Z. et al., "25 Gbps low-voltage waveguide Si-Ge avalanche photodiode," Optica, vol. 3, No. 8, Jul. 21, 2016, pp. 793-797.
Cong, H. et al., "High-speed waveguide-integrated Ge/Si avalanche photodetector," Chinese Physics B, vol. 25, No. 5, 2016, pp. 058503-1-058503-4.
Wang, X. et al., "80 GHz bandwidth-gain-product Ge/Si avalanche photodetector by selective Ge growth," 2009 Conference on Optical Fiber Communication, Mar. 22-26, 2009, pp. 1-3.

* cited by examiner

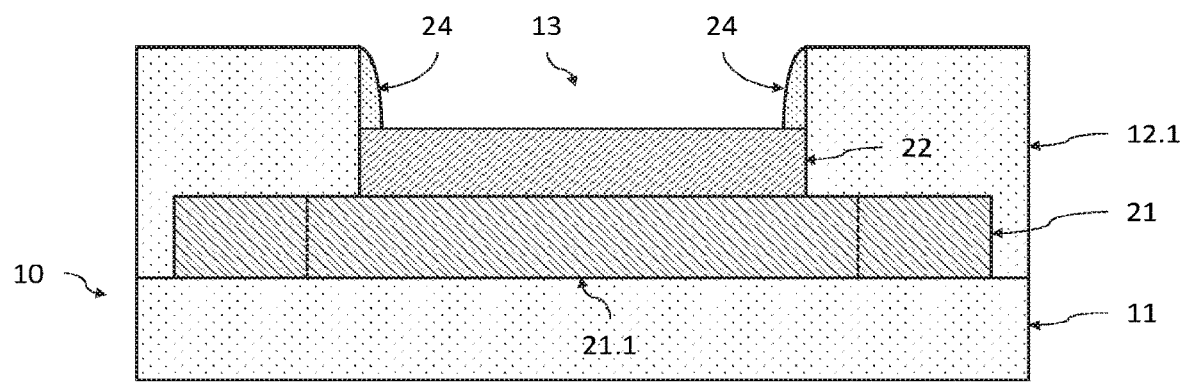
Fig.2G
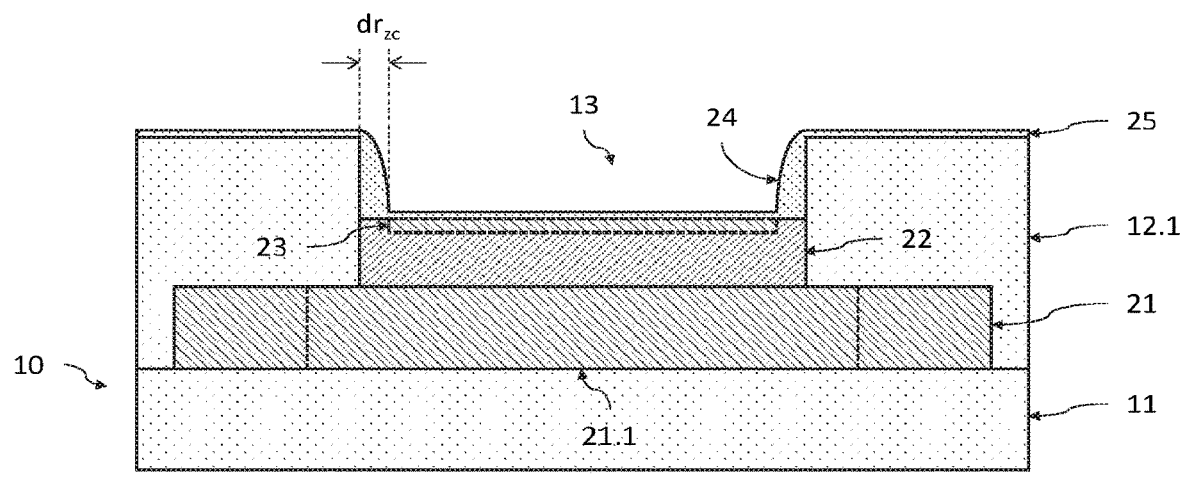
Fig.2H
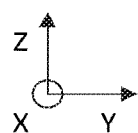

METHOD OF FABRICATION OF A PHOTONIC CHIP COMPRISING AN SACM-APD PHOTODIODE OPTICALLY COUPLED TO AN INTEGRATED WAVEGUIDE

TECHNICAL FIELD

The field of the invention is that of the methods of fabrication of photonic chips comprising at least one SACM-APD photodiode, in other words an avalanche photodiode of the SACM (for Separated Absorption Charge Multiplication) type optically coupled to a waveguide integrated into a substrate of the photonic chip. The invention may, in particular, be implemented in the framework of the technology known as integrated photonics on silicon or integrated silicon photonics.

PRIOR ART

Integrated photonics is a technology which consists in fabricating a photonic chip comprising an integrated circuit composed of at least one waveguide optically coupled to at least one active optical component such as a light source, a photodetector, or an optical modulator, amongst others. It is referred to as integrated in the sense that the integrated circuit and the active optical components are fabricated on the same carrier substrate. When the carrier substrate is an SOI (for Silicon On Insulator) substrate, this is then referred to as photonics on silicon or silicon photonics. The waveguides are then formed on a core of silicon surrounded by a cladding made of an oxide of silicon. The photodiodes, for example avalanche photodiodes, may be formed using germanium owing to the high coefficient of absorption of this material. Such photonic chips may notably be used in the framework of datacoms or telecoms communications, given that silicon is transparent to the optical telecoms wavelengths, in other words 1.3 µm and 1.55 µm.

The photodiodes of such photonic chips may each be formed from a stack, along an axis orthogonal to a carrier substrate, of a portion of p-doped contact, of a portion of n-doped contact and of an absorption portion situated between the two contact portions. This is then a mesa configuration, which differs from the plane configuration in which the various portions are aligned along an axis parallel to the carrier substrate.

A photodiode in a mesa configuration may either be illuminated via the surface or optically coupled to a waveguide integrated into the photonic chip. In the first case, the light radiation may be transmitted for example by an optical fiber, which may then be assembled on the photonic chip along an axis orthogonal or inclined with respect to the carrier substrate. In the second case, the light radiation propagates within the waveguide integrated into the photonic chip, which then extends in a plane parallel to the carrier substrate. The waveguide may be optically coupled to the absorption portion in an evanescent manner when it extends in a plane different from that of the absorption portion. On the other hand, when it extends in a manner coplanar to that of the absorption portion, the optical coupling is then direct.

The photodiodes may be avalanche photodiodes (or APD) of the SACM (for Separated Absorption Charge Multiplication) type. These photodiodes comprise a thin doped 'charge' region, situated on the multiplication portion at the interface with the absorption portion. Such photodiodes are generally denoted as SACM-APD. It is recalled here that an APD is a photodiode whose high reverse biasing causes a multiplication of the charge carriers present in the depletion region by virtue of the impact ionization phenomenon. The presence of the charge region prevents the space-charge region from extending into the absorption portion owing to the high reverse biasing, and hence prevents the two types of photogenerated carriers from being present in the multiplication portion. The charge region therefore allows the uniformity of the electric field in the multiplication portion to be controlled. In the case of germanium photodiodes on silicon, the absorption portion is made of germanium, and the charge region and the multiplication portion are made of silicon. The charge region thus allows the multiplication in the Si and the extraction of the photogenerated carriers in the Ge to be optimized.

However, it turns out that the photodiodes in the mesa configuration can present risks of breakdown at the edges of the photodiode, owing to the higher value of the generation rate of charge carriers at the edges of the photodiode than in the center. In order to reduce the risks of breakdown, and more generally to improve the performance characteristics of the photodiode, a known solution is to form the multiplication portion, the charge region and the absorption portion so that they each have their periphery recessed with respect to the underlying portion or region. Thus, the charge region has its periphery recessed by a non-zero value $dr_{zc}$ with respect to the edges of the multiplication portion, and the absorption portion has its periphery recessed by a non-zero value $dr_{pa}$ with respect to the edges of the charge region.

Thus, the article by Huang et al entitled 25 *Gbps low-voltage waveguide Si—Ge avalanche photodiode*, Optica, Vol. 3, No. 8, 793 (2016) describes a method of fabrication of a germanium photodiode SACM-APD on silicon in the mesa configuration, optically coupled to an integrated waveguide. Here, the absorption portion is dimensioned such that it presents a peripheral recessing with respect to the underlying charge region. For this purpose, the fabrication method comprises a step for selective epitaxial growth of the germanium absorption portion within a cavity opening onto the p doped silicon charge region, this cavity being defined by photolithography. This could therefore lead to a risk of an error in positioning of the absorption portion with respect to the charge region, this positioning error being likely to degrade the optical and/or electronic properties of the photodiode.

Furthermore, the article by Dong et al entitled *Germanium-tin multiple quantum well on silicon avalanche photodiode for photodetection at two micron wavelength* Semicond. Sci. Technol. 31, 095001 (2016) describes a method of fabrication of a germanium photodiode on silicon in the mesa configuration and illuminated via the surface. Here, the absorption portion, the space-charge region and the multiplication portion have their peripheries successively recessed, obtained during a step for formation of the mesa configuration by means of a chemical etch in an aqueous solution of $(NH_4)_2S$. The amount of the peripheral recessing depends notably on the operating conditions of the chemical etch and on the properties of the etching agent and on the materials to be etched, and cannot therefore be accurately controlled. Moreover, given that there is no etch endpoint detection, the photodiode cannot be optically coupled to an integrated waveguide, given that the latter is likely to be partially etched when the chemical etch is implemented.

The documents US2014/291682A1, US2019019903A1 and JP2017147352A, the article by Cong et al entitled *High-speed waveguide-integrated Ge/Si avalanche photo-*

*detector*, Chinese Physics B, Vol. 25, n°5, 58503 (2016), and the article by Wang et al entitled 80 *GHz bandwidth-gain-product Ge/Si avalanche photodetector by selective Ge growth,* 2009 Conference on Optical Fiber Communication, 22-26 mars 2009, describe various examples of APD-SACM photodiodes.

DESCRIPTION OF THE INVENTION

The aim of the invention is to overcome, at least in part, the drawbacks of the prior art, and more particularly to provide a method of fabrication of a photonic chip comprising an APD-SACM photodiode, in the mesa configuration, optically coupled to an integrated waveguide, where the optical and/or electronic properties of the photodiode are optimized.

For this purpose, one subject of the invention is a method of fabrication of a photonic chip comprising at least one photodiode of the SACM-APD type lying on a carrier substrate, and a waveguide extending parallel to the carrier substrate and optically coupled to the photodiode. The method comprises the following steps:
  formation of a contact portion made of a first semiconductor material doped according to a first type of conductivity, starting from a layer of the first semiconductor material lying on an insulating layer of the carrier substrate;
  deposition of an encapsulation layer covering the contact portion, and formation of an opening through the encapsulation layer opening onto a surface of the contact portion;
  formation, in the through-opening, of a multiplication portion made of the first semiconductor material starting from the surface of the contact portion, the multiplication portion having a thickness less than a height of the through-opening;
  formation of a first spacer made of a first dielectric material, such that it covers the sides of the through-opening together with a peripheral part of constant width of a surface of the multiplication portion;
  formation of a charge region in the multiplication portion flush with an upper face of the latter, the charge region being bounded laterally by the first spacer such that its periphery is recessed by a constant amount $dr_{zc}$ with respect to an edge of the multiplication portion;
  formation of a second spacer made of a second dielectric material, distinct from the first dielectric material, such that it covers the first spacer together with peripheral part of constant width of a surface of the charge region;
  formation of an absorption portion made of a second semiconductor material, starting from a free surface of the charge region, the absorption portion being bounded laterally, at the interface with the charge region, by the second spacer such that its periphery is recessed by a constant amount $dr_{pa}$ with respect to an edge of the charge region.

Some preferred, but non limiting, aspects of this fabrication method are the following.

The first dielectric material may be designed to be selectively etched with respect to the material of the encapsulation layer and to the first semiconductor material, and the second dielectric material may be designed to be selectively etched with respect to the first dielectric material.

The step for forming the first spacer may comprise:
  a conformal deposition of a first spacer layer of the first dielectric material, in such a manner as to cover an upper face of the encapsulation layer, the sides of the through-opening, and the surface of the multiplication portion, the thickness of the first spacer layer defining later on the value $dr_{zc}$ of the peripheral recessing of the charge region with respect to the multiplication portion;
  an anisotropic etch of the first spacer layer, in such a manner as to liberate the upper face of the encapsulation layer together with a central part of a surface of the multiplication portion, and to only conserve a peripheral part forming said first spacer.

The step for forming the second spacer may comprise:
  a conformal deposition of a thin protective layer for the first dielectric material, in such a manner as to cover the encapsulation layer, the first spacer, and the charge region;
  a conformal deposition of a second spacer layer of the second dielectric material, in such a manner as to cover the thin protective layer, the thickness of the second spacer layer defining later on the value $dr_{pa}$ of the peripheral recessing of the absorption portion with respect to the charge region;
  an anisotropic etch of the second spacer layer, in such a manner as to liberate a surface area of the thin protective layer situated on the upper face of the encapsulation layer, together with a central part situated on the charge region, and to only conserve a peripheral part forming said second spacer;
  an anisotropic etch of the thin protective layer, in such a manner as to liberate the upper face of the first encapsulation layer together with a central part of a surface of the charge region.

The charge region may be formed, between the conformal deposition of the thin protective layer and the conformal deposition of the second spacer layer, by ion implantation of dopants into the multiplication portion through the thin protective layer.

The step for forming the multiplication portion may comprise an epitaxy of the second semiconductor material in such a manner that the epitaxied material spills out from the through-opening, followed by a step for chemical-mechanical planarization of the epitaxied material, then by a partial etch of the epitaxied material, in such a manner as to form the multiplication portion.

The waveguide may be formed from the layer of the first semiconductor material, and extend in a coplanar manner and contiguously with the contact portion.

The fabrication method may comprise the following steps:
  deposition of an additional encapsulation layer covering the absorption portion;
  formation of conducting vias and of electrical studs, the electrical studs lying on the encapsulation layers, and the conducting vias connecting the contact portion and the absorption portion to the electrical studs.

The invention also relates to a photonic chip comprising at least one photodiode of the SACM-APD type lying on a carrier substrate and a waveguide extending parallel to the carrier substrate and optically coupled to the photodiode, the photodiode comprising a stack composed of:
  a contact portion made of a first semiconductor material doped according to a first type of conductivity, lying on an insulating layer of the carrier substrate;
  an encapsulation layer, covering the contact portion and having a through-opening opening onto the contact portion;
  a multiplication portion, lying on and in contact with the contact portion, and situated in the through-opening;

a charge region, situated in the multiplication portion and flush with an upper face of the latter, and bounded laterally by a first spacer made of a first dielectric material extending in contact with the sides of the through-opening such that the charge region has a constant peripheral recessing $dr_{zc}$ with respect to an edge of the multiplication portion;

an absorption portion, lying on and in contact with the charge region, and situated in the through-opening, and bounded laterally, at the interface with the charge region, by a second spacer made of a second dielectric material distinct from the first dielectric material and extending between and in contact with the first spacer and with the absorption portion, such that the absorption portion has a constant peripheral recessing $dr_{pa}$ with respect to an edge of the charge region.

The absorption portion may be formed using germanium, and the multiplication portion and the contact portion may be made of silicon.

The first spacer may be formed of a silicon nitride, and the second spacer may be formed of a silicon oxide.

The waveguide may be coplanar and formed contiguously with the contact portion.

The waveguide may comprise a broadening region in which its width increases in the direction of the contact portion, and the photodiode may comprise a coupling region formed by the multiplication portion, the charge region and the absorption portion, and situated facing the broadening region, whose width decreases in the direction of the waveguide.

BRIEF DESCRIPTION OF THE DRAWINGS

Other aspects, aims, advantages and features of the invention will become more clearly apparent upon reading the detailed description that follows of preferred embodiments of the latter, given by way of non-limiting example, and presented with reference to the appended drawings in which.

DETAILED DESCRIPTION OF PARTICULAR EMBODIMENTS

In the figures and in the following part of the description, the same references represent identical or similar elements. In addition, the various elements are not shown to scale for the sake of the clarity of the figures. Furthermore, the various embodiments and variants are not exclusive from one another and may be combined together. Unless otherwise indicated, the terms "substantially", "around", "of the order of" mean to the nearest 10%, and preferably to the nearest 5%. Furthermore, the terms "in the range between . . . and . . . " and equivalent expressions mean that the limits are included, unless otherwise stated.

Figure 1A:
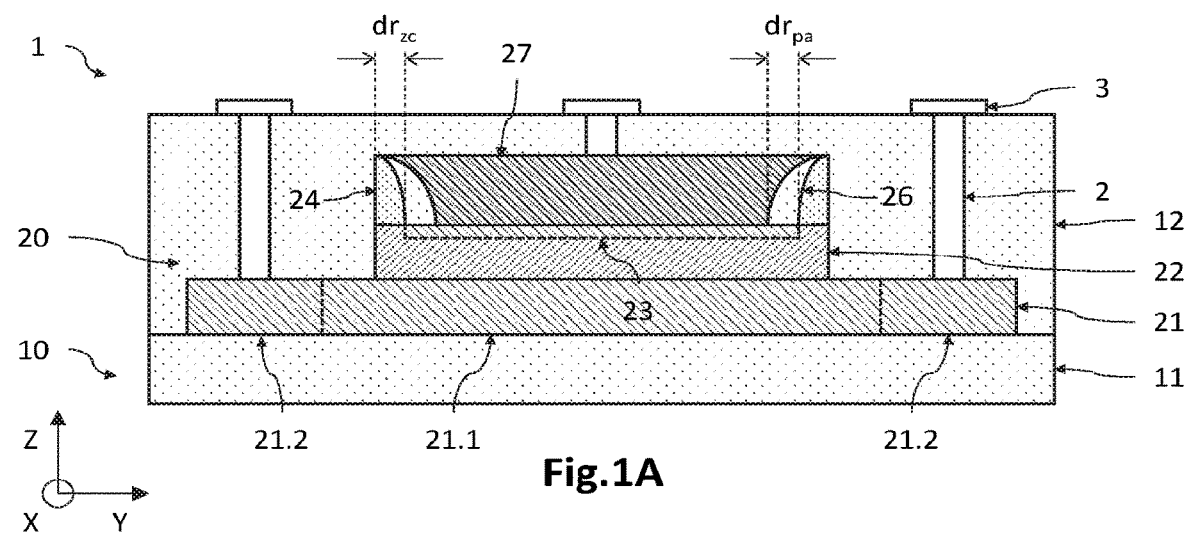
FIGS. 1A to 1C are schematic and partial views of a photonic chip obtained by a fabrication method according to one embodiment, the photonic chip comprising an APD-SACM photodiode in the mesa configuration using germanium on silicon, optically coupled to an integrated waveguide.
Figure 1B:
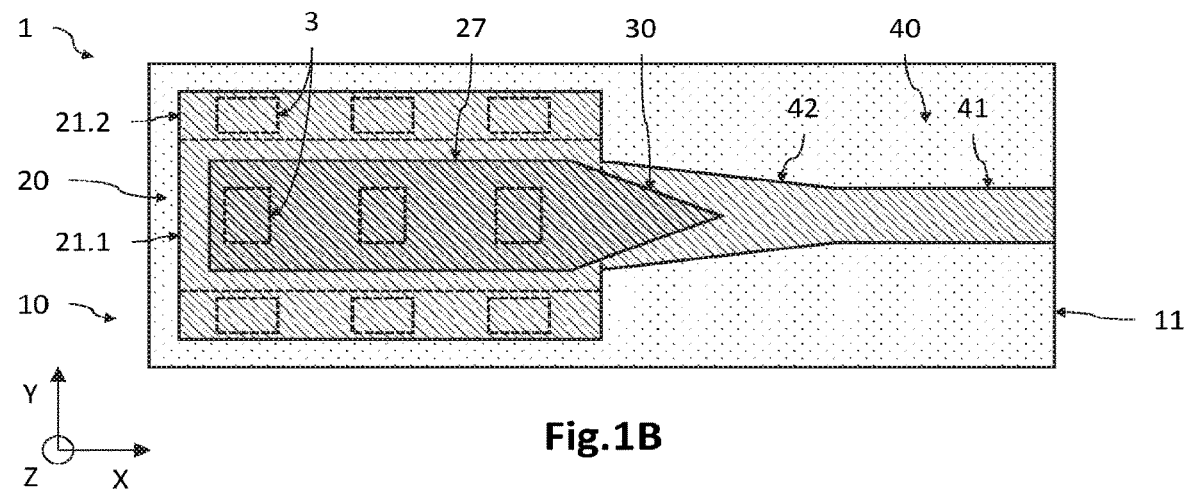
Figure 1C:
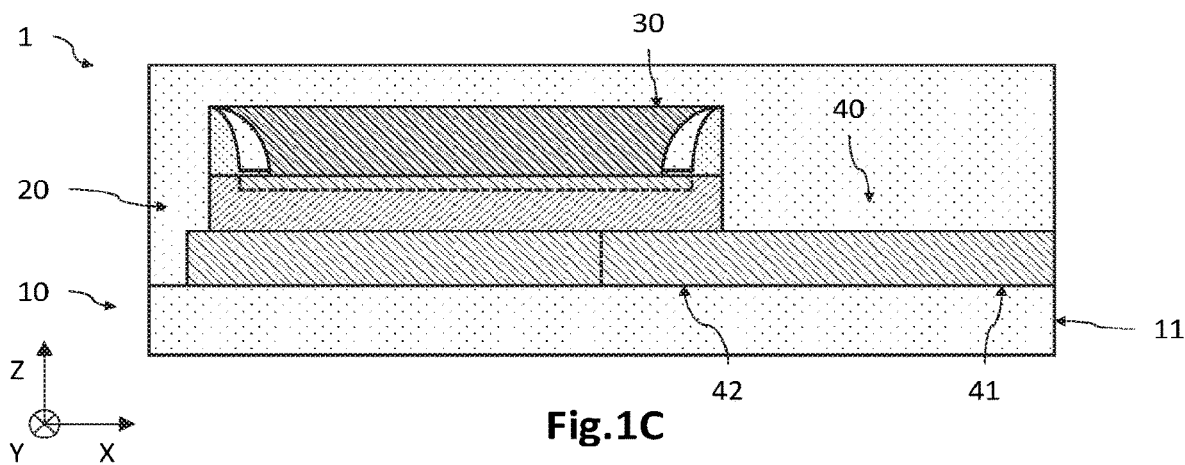

FIGS. 1A to 1C are schematic and partial cross-sectional and top views of a photonic chip 1 comprising at least one photodiode 20 of the APD-SACM type optically coupled to an integrated waveguide 40, this photonic chip 1 having been obtained by a fabrication method according to one embodiment.

A three-dimensional orthogonal reference frame XYZ is defined here and for the following part of the description, where the axes X and Y form a plane parallel to the main plane of a carrier substrate 10 of the photonic chip 1, the axis X here being oriented parallel to the waveguide 40 near the coupling region with the photodiode 20, and where the axis Z is oriented substantially orthogonal to the main plane of the carrier substrate 10. In the following part of the description, the terms "lower" and "upper" are understood as being relative to an increasing positioning when moving away from the carrier substrate 10 in the direction +Z.

In this example, the photodiode 20 and the waveguide 40 are formed in an integrated photonics technology, in other words the photodiode 20 and the waveguide 40 are formed from the same carrier substrate 10 of the photonic chip 1. In addition, this example relates to silicon photonics and to a photodiode 20 using germanium on silicon. In other words, the waveguide 40, the contact portion 21 and the multiplication portion 22 are made of silicon and the absorption portion 27 of the photodiode 20 is formed using germanium.

The photodiode 20 of the SACM-APD type has a mesa configuration given that it comprises a semiconductor stack oriented in the axis Z orthogonal to the plane XY of the carrier substrate 10, this semiconductor stack being composed of:

a contact portion 21, lying on an insulating layer 11 of the carrier substrate 10 and made of a first semiconductor material doped according to a first type of conductivity, for example here made of n+ doped silicon;

a multiplication portion 22, lying on and in contact with the contact portion 21, and made of the first semiconductor material, here made of intrinsic silicon (not intentionally doped);

a charge region 23, situated in the multiplication portion 22 and flush with the upper face of the latter, and made of the first semiconductor material doped according to a second type of conductivity, here made of p doped Silicon;

an absorption portion 27, lying on and in contact with the charge region 23, and formed using a second semiconductor material, for example made of intrinsic germanium.

According to the invention, the absorption portion 27 is bounded laterally by a first spacer 24 made of a first dielectric material, and by a second spacer 26 made of a second dielectric material distinct from the first dielectric material. The first spacer 24 allows the charge region 23 to be bounded laterally with respect to the multiplication portion 22, and the value $dr_{zc}$ of the peripheral recessing that the charge region 23 forms with respect to the edges of the underlying multiplication portion 22 to be defined. The second spacer 26 allows the absorption portion 27 to be bounded laterally with respect to the charge region 23, and the value $dr_{pa}$ of the peripheral recessing that the absorption portion 27 forms with respect to the edges of the underlying charge region 23 to be defined.

Given that the first spacer 24 and the second spacer 26 have a constant transverse dimension (thickness in the plane XY) along the periphery of the photodiode 20, the distances $dr_{zc}$ and $dr_{pa}$ are also constant along the periphery of the photodiode 20. A self-alignment of the absorption portion 27, of the charge region 23 and of the multiplication portion 22 is therefore obtained, which contributes to optimizing the optical and/or electronic properties of the photodiode 20.

Furthermore, as described in detail hereinbelow, amongst the steps for forming the multiplication portion 22, the charge region 23, and the absorption portion 27, only the step for forming the multiplication portion 22 implements a photolithographic operation. The risks of misalignment between the absorption portion 27, the charge region 23 and the multiplication portion 22, linked to an implementation of several successive photolithographic operations, are thus avoided. Furthermore, the complexity and the costs of the fabrication method are reduced, given that the implementation of the photolithographic operations involves taking into account relative alignment tolerances between the absorption, multiplication and charge portions.

The insulating layer 11 is made of a dielectric material. This may be a layer of oxide of a carrier substrate 10 of the SOI (for Silicon On Insulator) type, and of thickness in the range for example between 700 nm and 2000 nm. The carrier substrate 10 may comprise or carry active or passive optical elements, including the waveguide 40 described hereinbelow. In the framework of silicon photonics, the waveguides are preferably formed in a silicon core surrounded by a cladding made of a silicon oxide.

The contact portion 21 of the photodiode 20 is formed from a first semiconductor material, doped according to a first type of conductivity. Preferably, it is made of n doped silicon. It comprises a central region 21.1 of n+ doped Si flanked, in the plane XY and along the axis Y, by two lateral regions 21.2 of n++ doped Si. The contact portion 21 lies on and in contact with the insulating layer 11. It is preferably formed from a layer of the first semiconductor material, for example from a layer of Si in the framework of a carrier substrate 10 of the SOI type. The contact portion 21 may have a thickness in the range for example between 220 nm and 500 nm.

The multiplication portion 22 of the photodiode 20 is formed using the first semiconductor material, and is preferably intrinsic (not intentionally doped). It lies on and in contact with the contact portion 21, and more precisely on the central region 21.1 of the contact portion 21. It has a surface area in the plane XY less than that of the central contact region. Preferably, it is made of intrinsic silicon, and has a thickness in the range for example between around 100 nm and 300 nm.

The charge region 23 of the photodiode 20 is a doped region of the multiplication portion 22 and flush with the upper face of the latter. It is doped according to a second type of conductivity opposite to the first type. Here, it corresponds to a region of p-doped Si situated in the multiplication portion 22. More precisely, the charge region 23 extends in the first semiconductor material of the multiplication portion 22 from the upper face of the latter. It is therefore flush with the upper face of the multiplication portion 22, and it is therefore disposed between the multiplication portion 22 and the absorption portion 27. It has a depth in the range for example between around 20 nm and 100 nm and a doping level in the range for example between around $10^{18}$ and $10^{19}$ at/cm$^2$. It has a surface area in the plane XY less than that of the multiplication portion 22. More precisely, it has a peripheral recessing $dr_{zc}$ with respect to the edge of the multiplication portion 22. The value $dr_{zc}$ is substantially constant around the rim of the photodiode 20. It may be of the order of 200 nm. The term peripheral recessing is understood to mean a non-zero distance dr in the plane XY here separating the edges of the charge region 23 with respect to the edges of the multiplication portion 22.

The recessing is said to be peripheral in the sense that this distance dr is non-zero around the whole rim of the photodiode 20.

The absorption portion 27 of the photodiode 20 is a portion made of a second semiconductor material, different from the first semiconductor material. Preferably, the multiplication portion 22 is formed using germanium, for example made of germanium or its compounds. It may thus be made of intrinsic germanium, or comprise quantum wells for example made of GeSn. It has a thickness in the range between around 200 nm and 1 μm. It has a surface area in the plane XY, at the interface with the charge region 23, less than the surface area of the latter. More precisely, it has a peripheral recessing $dr_{pa}$ with respect to the edges of the charge region 23. The value $dr_{pa}$ is substantially constant around the rim of the photodiode 20. It may be of the order of 200 nm. In this example, its surface area increases in the direction +Z, but, as a variant, it may remain substantially constant.

The photodiode 20 also comprises a first spacer 24 and a second spacer 26, which lie on the multiplication portion 22 along the axis Z, and surround the absorption portion 27 in the plane XY.

The first spacer 24 extends continuously, in the plane XY, between and in contact with the encapsulation layer 12 and with the second spacer 26. It allows the surface area of the charge region 23 to be bounded laterally in the plane XY, when the latter is formed, and more precisely the value $dr_{zc}$ of the peripheral recessing of the charge region 23 with respect to the edges of the multiplication portion 22 to be defined. It is made of a first dielectric material designed to be selectively etched with respect to the material of the encapsulation layer 12 and to the first semiconductor material. Thus, in the case of photonics on silicon, where the semiconductor material of the multiplication portion 22 is silicon and where the encapsulation material is a silicon oxide, the first spacer 24 may be made of a silicon nitride (e.g. $Si_3N_4$), amongst others. It covers and is in contact with a peripheral part of the surface of the multiplication portion 22. The first spacer 24 has a transverse dimension, in the plane XY, which, in this example, decreases in the direction +Z. This transverse dimension may, as a variant, remain substantially constant. It may be of the order of 200 nm at the interface with the multiplication portion 22. This value defines the distance $dr_{zc}$ between the edges of the multiplication portion 22 and the edges of the charge region 23.

The second spacer 26 extends continuously, in the plane XY, between and in contact with the first spacer 24 and the absorption portion 27. It allows the surface area of the absorption portion 27 to be laterally defined in the plane XY, when the latter is formed, and more precisely the value $dr_{pa}$ of the peripheral recessing of the absorption portion 27 with respect to the edes of the charge region 23 to be defined. It is made of a second dielectric material distinct from the first dielectric material, and is designed to be selectively etched with respect to the dielectric material of the first spacer 24. Thus, in the case where the first spacer 24 is made of a silicon nitride, the second spacer 26 may be made of a silicon oxide (e.g. $SiO_2$). Thus, the second spacer 26 covers a peripheral part of the surface area of the charge region 23. It has a transverse dimension, in the plane XY, which, in this example, decreases in the direction +Z. This transverse dimension may, as a variant, remain substantially constant in the direction +Z. It may be of the order of 200 nm at the interface with the charge region 23. This value defines the distance $dr_{pa}$ between the edges of the charge region 23 and the edges of the absorption portion 27.

The encapsulation layer 12 entirely covers the photodiode 20, in other words the contact portion 21, the absorption portion 27, and the sides of the photodiode 20 formed notably by the edges of the multiplication portion 22 and by the edges of the first spacer 24. It is made of a dielectric material, for example of a silicon oxide. It preferably exhibits an index of refraction identical or similar to that of the material of the insulating layer 11. Thus, the insulating layer 11 and the encapsulation layer 12 may participate together in forming the cladding of the waveguide 40.

The photodiode 20 comprises conducting vias 2 and electrical studs 3, which allow the photodiode 20 to be biased and thus the photogenerated carriers to be collected. The electrical studs 3 lie on the encapsulation layer 12, and the conducting vias 2 pass through the encapsulation layer 12 so as to electrically connect the electrical studs 3 to the lateral regions 21.2 of the contact portion 21, on the one hand, and to the absorption portion 27, on the other.

A waveguide 40 extends parallel to the plane of the carrier substrate 10, in such a manner as to enable an optical coupling with the photodiode 20. In this example, it extends in a manner coplanar with the contact portion 21 and is made contiguous to the latter. It is formed of a core made of a material with a high index of refraction surrounded by a cladding made of a material with a low index of refraction. Here, the core is made of the same material of that of the contact portion 21, in other words of silicon, and the cladding is formed by the insulating layer 11 and by the encapsulation layer 12, the latter being made of a silicon oxide.

The waveguide 40 advantageously comprises a broadening region 42 allowing the optical coupling between the waveguide 40 and the photodiode 20 to be optimized. The waveguide 40, in this broadening region 42, exhibits an increase of its width in the plane XY in the direction −X, from a nominal value to a value that may be substantially equal to the width of the absorption portion 27. In a correlated manner, the photodiode 20 comprises a coupling region 30 in which the multiplication portion 22 and the absorption portion 27 extend at least partially over the broadening region 42 of the waveguide 40, and have a width which decreases in the direction +X between a nominal value and a minimum value in the direction of the waveguide 40. Thus, the broadening region 42 of the waveguide 40 and the coupling region 30 of the photodiode 20 allow the guided optical mode to spatially spread out in the direction of the absorption portion 27, thus improving the evanescent coupling between the waveguide 40 and the photodiode 20, and the absorption of the optical mode by the latter.

Thus, the photodiode 20 of the SACM-APD type, in the mesa configuration, is optically coupled to an integrated waveguide 40, and thus differs from the photo diodes illuminated via the surface, in other words here along the axis Z. The photodiode 20 and the waveguide 40 are advantageously fabricated in the framework of the technology of integrated silicon photonics. The photodiode 20 exhibits a self-alignment of the absorption portion 27 with respect to the charge region 23, and of the charge region 23 with respect to the multiplication portion 22, this self-alignment being obtained by the presence of the first and second spacers 24, 26, the latter also allowing the value of the various peripheral recessings to be precisely defined. The photodiode 20 thus exhibits optimized optical and/or electronic properties given that the risks of relative misalignment are reduced or even eliminated. Furthermore, as detailed in the following, the spacers 24, 26 allow only a single photolithographic operation to be carried out during the steps for forming the multiplication portion 22, the charge region 23 and the absorption portion 27.

A method of fabrication of a photonic chip 1 such as illustrated in FIGS. 1A to 1C is now described with reference to FIGS. 2A to 2N. In this example, the photodiode 20 and the waveguide 40 are formed in the framework of the technology of integrated silicon photonics, and the photodiode 20 is of the germanium on silicon type. In other words, in this example, the first semiconductor material is silicon and the second semiconductor material is germanium. The first spacer 24 is made of a silicon nitride and the second spacer 26 is made of a silicon oxide.

During a first step (FIGS. 2A-2C), the contact portion 21 of the photodiode 20, and notably the central 21.1 and lateral 21.2 regions of the contact portion 21 are formed. Furthermore, the integrated waveguide 40 may also be formed such that the photodiode 20 is optically coupled to a waveguide 40 which extends in a manner coplanar, and here contiguously, with the contact portion 21.

Figure 2A:
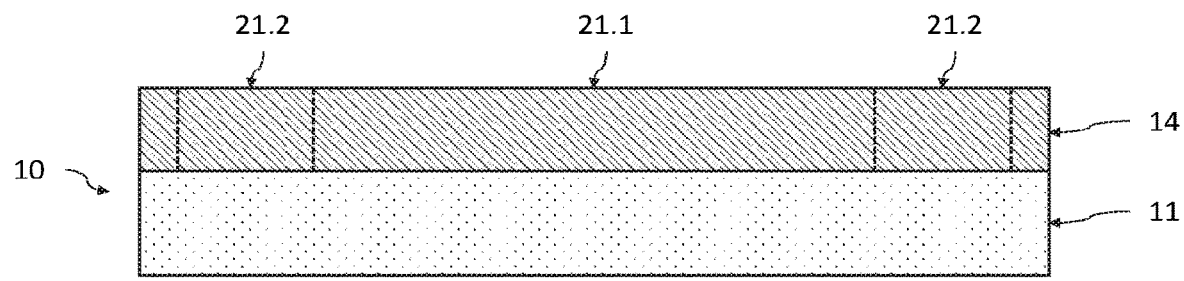
FIGS. 2A to 2N are cross-sectional or top views illustrating various steps of a method of fabrication of a photonic chip identical or similar to that illustrated in FIG. 1A-1C.

With reference to FIG. 2A, a carrier substrate 10 is provided comprising a layer 14 of the first semiconductor material lying on an insulating layer 11. Preferably, the carrier substrate 10 is an SOI substrate, in other words it comprises a layer of silicon 14 which covers a layer of a silicon oxide (BOX for Buried Oxide). The layer of silicon 14 may have a thickness of the order of 220 nm to around 500 nm, and the insulating layer 11 may have a thickness of the order of 700 nm to around 2000 nm.

Subsequently, a localized doping in the layer of silicon 14 is carried out by ion implantation of dopants so as to obtain an n+ doped central region 21.1 flanked by two n++ doped lateral regions 21.2. The doping level for the central region 21.1 made of n+ doped Si may be in the range between around $10^{17}$ and $10^{18}$ at/cm$^3$, and that for the lateral regions 21.2 made of n++ doped Si may be greater than or equal to around $10^{19}$ at/cm$^3$.

Figure 2B:
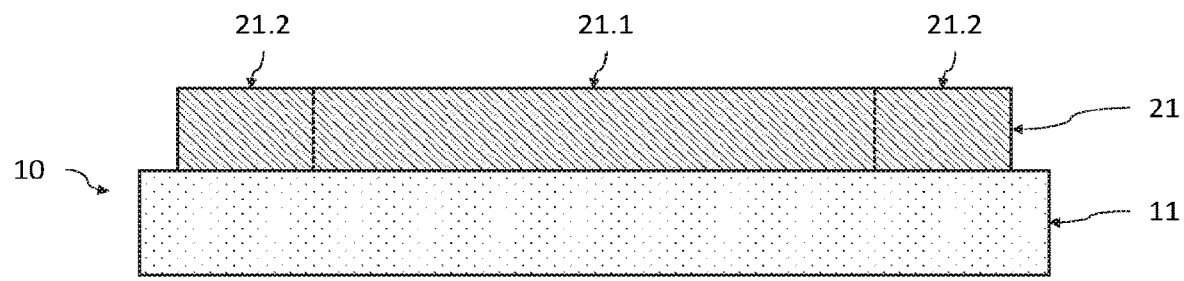
Figure 2C:
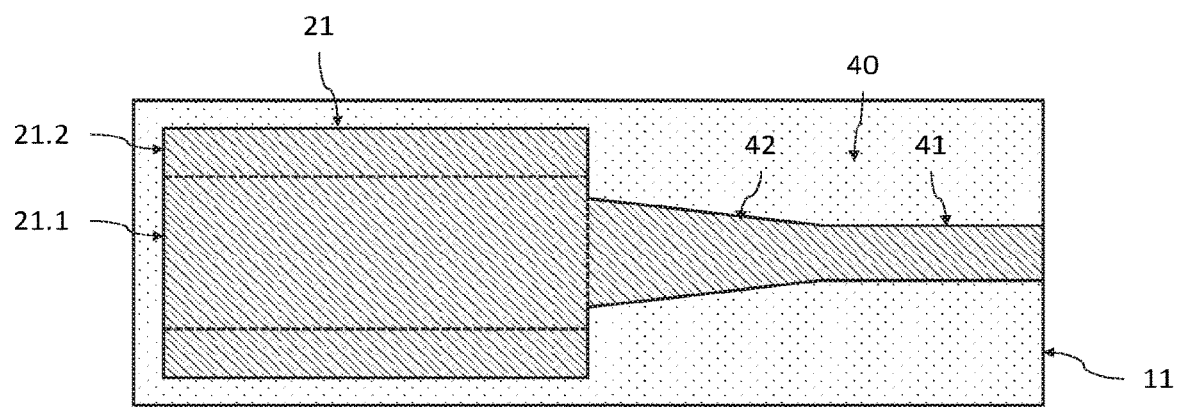

With reference to FIGS. 2B and 2C, the layer of silicon 14 is subsequently locally etched so as to spatially define the contact portion 21 in the plane XY. The contact portion 21 may have a width of the order of a few microns (e.g. between 2 and 10 μm) and a length of the order of a few tens of microns (e.g. between 5 and 30 μm). The central region 21.1 may have a width of the order of 0.5 μm to 3 μm and the lateral regions 21.2 a width of the order of 1μ to 3 μm.

Preferably, the waveguide 40 may be defined during the same etch step. It thus comprises a nominal longitudinal portion 41 and a broadening region 42. It is thus formed contiguously with the contact portion 21 of the photodiode 20. Thus, the waveguide 40 extends in a plane parallel to, and here coplanar with, the plane of the contact portion 21. There is therefore a lateral optical coupling between the integrated waveguide 40 and the photodiode 20.

Figure 2D:
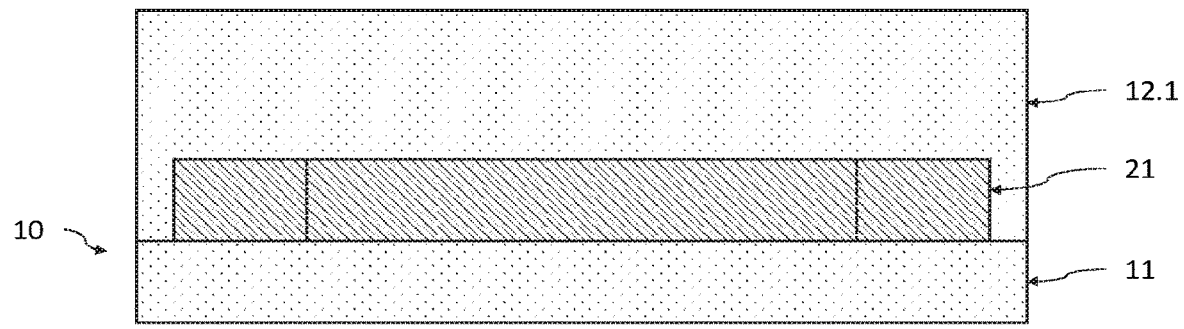

In a following step (FIGS. 2D to 2F), the multiplication portion 22 of the photodiode 20 is formed. For this purpose, with reference to FIG. 2D, a first encapsulation layer 12.1 of a dielectric material is deposited in such a manner as to cover the contact portion 21. This first encapsulation layer 12.1 may also cover the waveguide 40 and thus participate in the formation of the cladding. The dielectric material is preferably a material identical to that of the insulating layer 11, in other words here a silicon oxide. The thickness of the first encapsulation layer 12.1 is chosen so as to be equal to the sum of the thickness of the multiplication portion 22 and of the height of the spacers 24, 26.

Figure 2E:
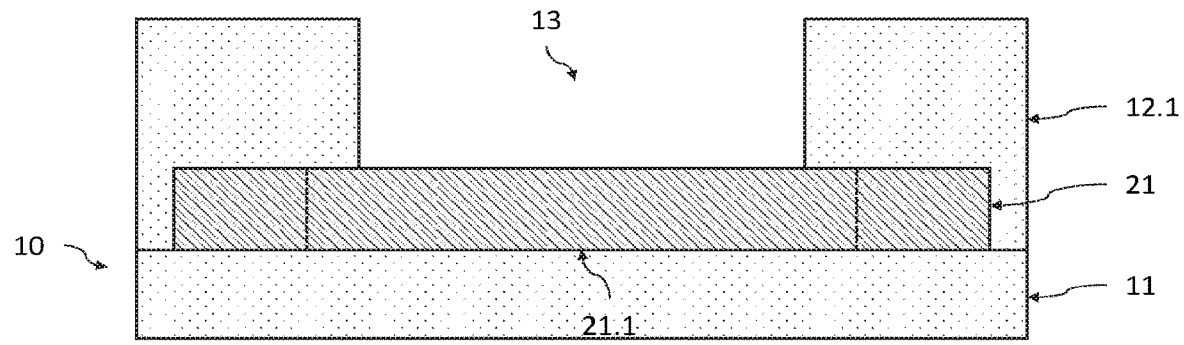

With reference to FIG. 2E, an opening 13 through the first encapsulation layer 12.1 is subsequently formed by photolithography and etch, in such a manner as to open out onto a surface of the contact portion 21, within the central region 21.1. This photolithographic operation is the only one in the set of steps for fabrication of the multiplication portion 22, of the charge region 23, and of the absorption portion 27. The through-opening 13 has transverse dimensions, in the plane XY, corresponding to that defined for the multiplication portion 22. Thus, the free surface of the contact portion 21 forms a nucleation surface for the epitaxial growth of the multiplication portion 22.

Figure 2F:
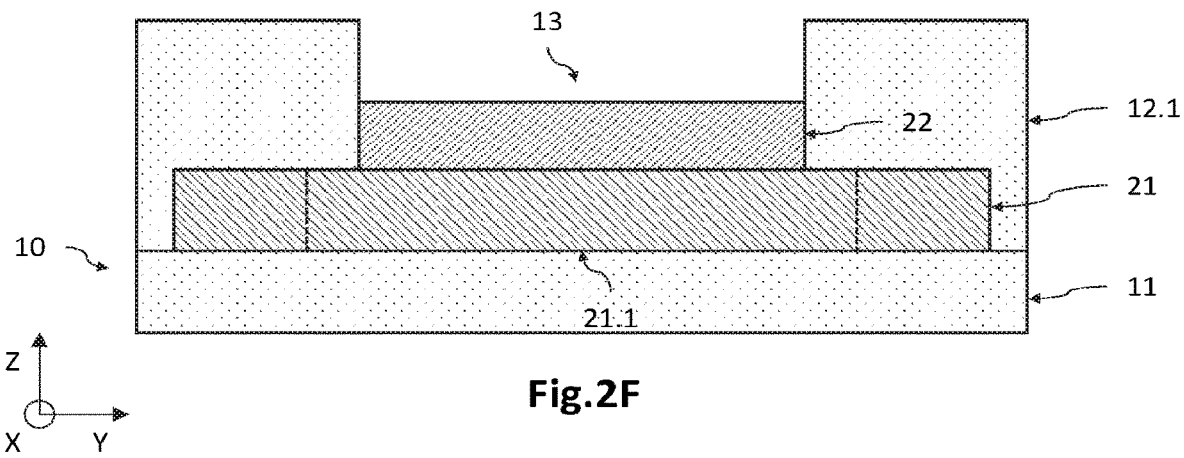

With reference to FIG. 2F, the multiplication portion 22 is subsequently formed by epitaxial growth starting from the free surface of the contact portion 21. 'Free surface' is understood to mean a surface uncoated by any material. The multiplication portion 22 is formed from the same semiconductor material as that of the contact portion 21, namely here silicon. It is preferably intrinsic, in other words not intentionally doped. The growth may be carried out by the conventional epitaxy techniques, for example by CVD (for Chemical Vapor Deposition) epitaxy.

The multiplication portion 22 has a thickness less than the height of the through-opening 13, such that the free surface of the sides of the through-opening 13 will later on be exploited to form the spacers 24, 26. For this purpose, the epitaxial growth may be formed such that the epitaxied silicon portion spills out from the through-opening 13. The epitaxy is then followed by a chemical-mechanical planarization (CMP) step allowing the over-spilling part of the epitaxied silicon portion to be eliminated, and the silicon potentially formed on the upper face of the encapsulation layer 12.1 to be removed. An operation for partial etch of the epitaxied portion (e.g. a dry etch) is subsequently carried out. A multiplication portion 22 of intrinsic silicon is thus obtained, whose thickness is less than the height of the through-opening 13. As a variant, the epitaxy phase may be stopped when it is considered that the epitaxied silicon portion has the desired thickness, however by forming an over-spilling part of epitaxied silicon followed by a partial etch, the presence of crystallographic facets of the silicon situated at the edges of the opening 13 will be avoided.

In a following step (FIG. 2G), the first spacer 24 is formed. For this purpose, a conformal deposition of a first spacer layer (not shown) of a first dielectric material is carried out, the latter being designed to be selectively etched with respect to the dielectric material of the first encapsulation layer 12.1, namely here a silicon oxide, and with respect to the semiconductor material of the multiplication portion 22, namely here silicon. The first dielectric material is, in this example, a silicon nitride, for example $Si_3N_4$. This first spacer layer therefore coats the upper face of the encapsulation layer 12.1, the sides of the through-opening 13, and the free surface of the multiplication portion 22.

The thickness of the first spacer layer will allow the transverse dimension (thickness in the plane XY) of the first spacer 24 to be defined, in particular at the interface with the multiplication portion 22. This is because the transverse dimension of the first spacer layer, on the sides of the through-opening 13, may vary along the axis Z: it may have a maximum value at the interface with the multiplication portion 22, and a minimum value at the top of the through-opening 13. This maximum value of the transverse dimension of the first spacer layer will allow the value $dr_{zc}$ of the peripheral recessing of the charge region 23 with respect to the edges of the multiplication portion 22 to be defined.

An anisotropic etch of the first spacer layer of $Si_3N_4$ is subsequently carried out in such a manner as to eliminate the part situated on the upper face of the encapsulation layer 12.1, and a central part situated on the multiplication portion 22. The etch stop may be carried out by detection of an end of etch of the oxide of the encapsulation layer 12.1. Only a peripheral part remains forming the first spacer 24, which extends over the sides of the through-opening 13 and continuously covers a peripheral part of constant width of the surface of the multiplication portion 22. The transverse dimension (thickness in the plane XY) of the first spacer 24, at the interface with the multiplication portion 22, may for example be of the order of a few hundreds of nanometers, and is advantageously in the range between around 150 nm and 250 nm. Given that the transverse dimension of the first spacer, at the interface with the multiplication portion 22, is constant along the rim of the photodiode, this therefore results in the peripheral part of the surface area of the multiplication portion, covered by the first spacer 24, also having a constant width along the rim of the photodiode.

In a following step (FIG. 2H), the charge region 23 is formed within the multiplication portion 22. For this purpose, a thin protective layer 25 of the first dielectric material, here SiN, is advantageously deposited in such a manner as to cover the free surface of the multiplication portion 22. This thin protective layer 25 also covers the upper face of the encapsulation layer 12.1 together with the first spacer 24. It allows the formation of defects linked to the ion implantation in the silicon of dopants to be limited during the formation of the charge region 23. The electrical properties of the charge region 23 are thus improved, and this allows a better epitaxial regrowth of the second semiconductor material, here germanium, when the absorption portion 27 is formed. The thin protective layer 25 may have a thickness for example of the order of 10 nm to 50 nm.

Subsequently, the charge region 23 is formed by ion implantation of dopants into the multiplication portion 22 through the thin protective layer 25, in a region not covered by the first spacer 24. The implanted region may have a depth of the order of a few tens of nanometers, for example in the range between around 20 nm and 50 nm. The charge region 23 thus has a peripheral recessing $dr_{zc}$ in the plane XY with respect to the edges of the multiplication portion 22, whose distance corresponds to the maximum value of the transverse dimension (thickness in the plane XY) of the first spacer 24 at the interface with the multiplication portion 22. Since this distance $dr_{zc}$ of the peripheral recessing is constant along the rim of the photodiode 20, there is accordingly a self-alignment of the charge region 23 with respect to the multiplication portion 22. This self-alignment is obtained without any photolithographic operation, but by the use of the first spacer 24.

Figure 2I:
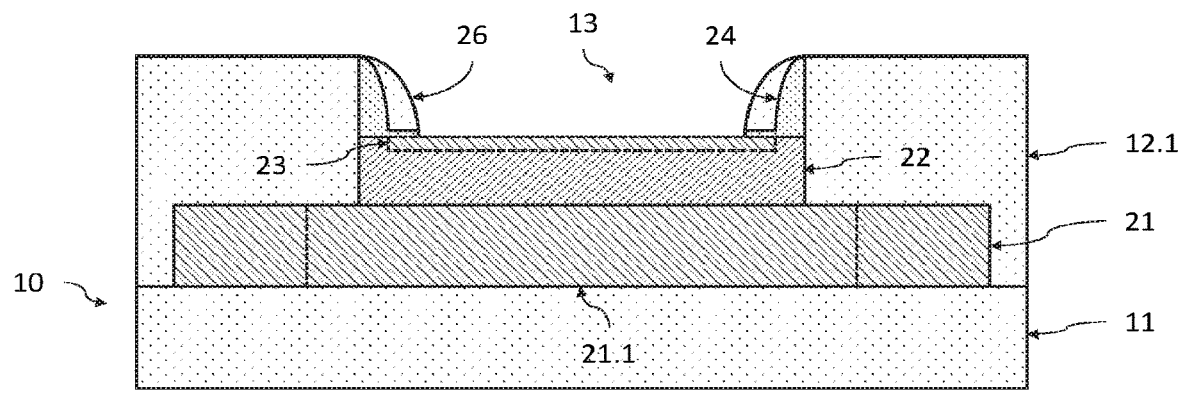

In a following step (FIG. 2I), the second spacer 26 is formed. For this purpose, a conformal deposition of a second spacer layer (not shown) of a second dielectric material is carried out, the latter being designed to be selectively etched with respect to the dielectric material of the first spacer 24, namely here silicon nitride. The second dielectric material is, in this example, a silicon oxide. The second spacer layer therefore coats the thin protective layer 25, on the upper face of the encapsulation layer 12.1, on the first spacer 24, and on the charge region 23.

The thickness of the second spacer layer will allow the transverse dimension (thickness in the plane XY) of the second spacer 26 to be defined, in particular at the interface with the charge region 23. Indeed, the transverse dimension of the second spacer layer, at the first spacer 24, may vary along the axis Z: it may exhibit a maximum value at the interface with the charge region 23, and a minimum value at the top of the through-opening 13. This maximum value of the transverse dimension of the second spacer layer will thus allow the value $dr_{pa}$ of the peripheral recessing of the absorption portion 27 to be defined with respect to the edges of the charge region 23.

An anisotropic etch of the second spacer layer of SiO is subsequently carried out in such a manner as to eliminate the part situated on the upper face of the encapsulation layer 12.1, and a central part situated on the multiplication portion 22 facing the charge region 23. The etch stop may be carried out by detection of an end of etch on the silicon nitride of the thin protective layer 25. There is therefore only a peripheral part remaining, forming the second spacer 26, which extends continuously in contact with the first spacer 24 and continuously covers a peripheral part of constant width of the surface of the charge region 23 (given that the second spacer 26 has a constant transverse dimension (thickness in the plane XY) at the interface with the charge region 23). The second spacer 26 has a transverse dimension (thickness in the plane XY), at the interface with the charge region 23, for example of the order of a few hundreds of nanometers and advantageously in the range between around 150 nm and 250 nm. An anisotropic etch of the thin protective layer 25 is subsequently carried out, the latter being selective with respect to the oxide of the encapsulation layer 12.1 and the silicon of the charge region 23. It should be noted that part of the thin protective layer 25 is not etched during the anisotropic etch: this part being covered by the second spacer 26.

Figure 2J:
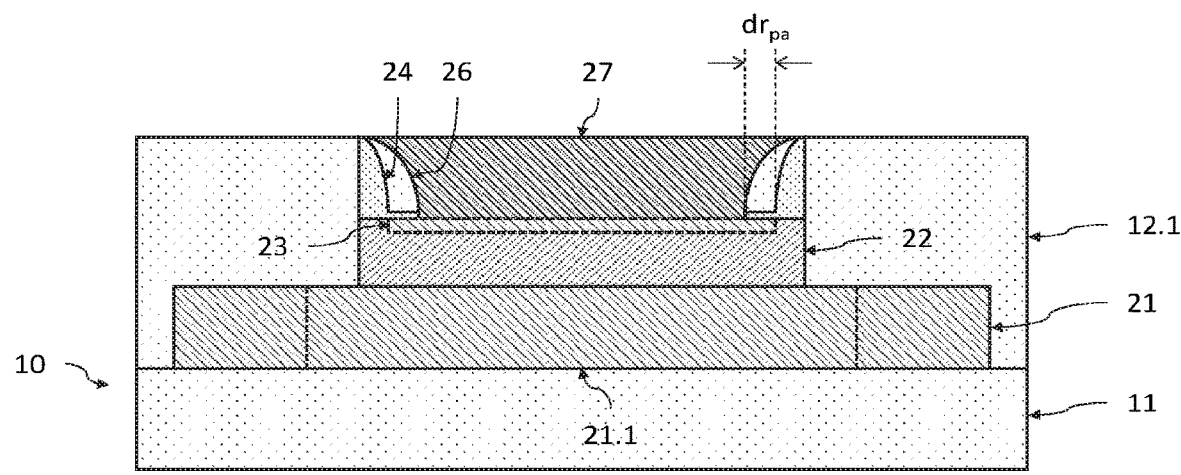

In a following step (FIG. 2J), the absorption portion 27 is formed. For this purpose, the epitaxial growth of a second semiconductor material is carried out, distinct from the first semiconductor material. In the framework of a photodiode 20 of the SACM-APD and Ge/Si type, the absorption portion 27 may be made of intrinsic germanium, or may use germanium and thus comprise quantum wells for example made of GeSn. The expression "using a chemical element" or "based on a chemical element" is understood to mean that the material corresponds to this chemical element or to its chemical compounds. In this example, the absorption portion 27 is made of intrinsic germanium. The growth may be carried out by conventional epitaxy techniques, for example by CVD (for Chemical Vapor Deposition) epitaxy.

Preferably, the absorption portion 27 is flush with the upper face of the encapsulation layer 12.1. For this purpose, the epitaxy phase is carried out such that the epitaxied portion of germanium comes flush with or spills out from the through-opening 13. The epitaxy is then followed by a step for chemical-mechanical planarization (CMP) allowing the over-spilling part of the epitaxied portion of germanium to be eliminated, and the germanium potentially formed on the upper face of the encapsulation layer 12.1 to be eliminated. The phenomenon of faceting of the epitaxied germanium at the edges of the absorption portion 27 is thus avoided.

An absorption portion 27 made of intrinsic germanium is thus obtained, situated in the through-opening 13 and bounded in the plane XY by the second spacer 26. It may have a transverse dimension in the plane XY which increases in the direction +Z given that the first and second spacers 24, 26 here have a transverse dimension which decreases in the direction +Z. In any case, the absorption portion 27 has a peripheral recessing $dr_{pa}$ in the plane XY with respect to the edges of the charge region 23, whose distance corresponds to the transverse dimension of the second spacer 26 at the interface with the charge region 23. Since this peripheral recessing $dr_{pa}$ is constant along the rim of the photodiode 20, there is therefore a self-alignment of the absorption portion 27 with respect to the charge region 23. This self-alignment is obtained without any photolithographic operation, but by the use of the second spacer 26.

Figure 2K:
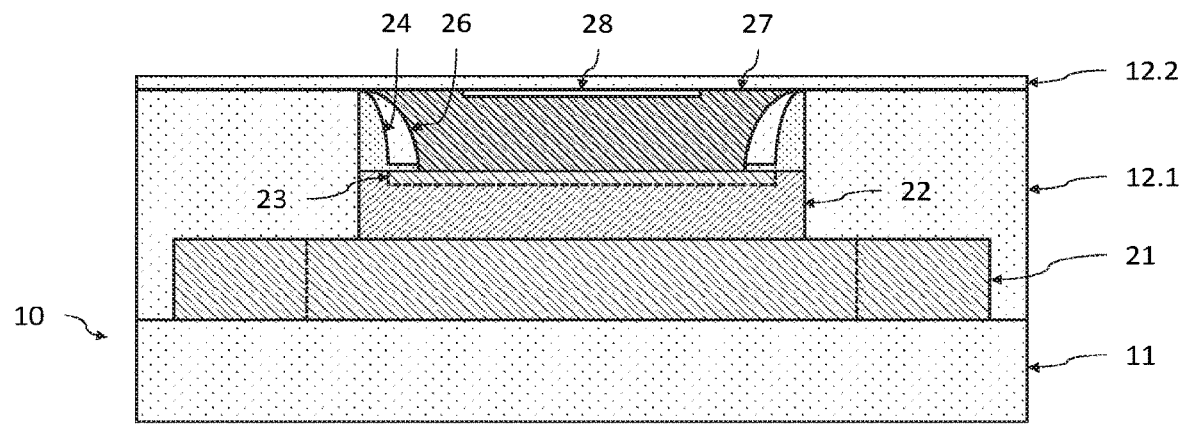

In a following step (FIGS. 2K to 2N), the formation of the photodiode 20 is finalized. Thus, with reference to FIG. 2K, a contact region 28 of p++ doped germanium is advantageously formed in the absorption portion 27. For this purpose, a protective layer 12.2, here of a silicon oxide, is deposited in such a manner as to cover the absorption portion 27. The protective layer 12.2 is a thin layer whose thickness may be of the order of 50 nm. The contact region 28 is subsequently formed by ion implantation of dopants into the germanium of the absorption portion 27, in such a manner as to obtain a localized p++ doped region. An anneal for activation of the dopants is subsequently carried out.

Figure 2L:
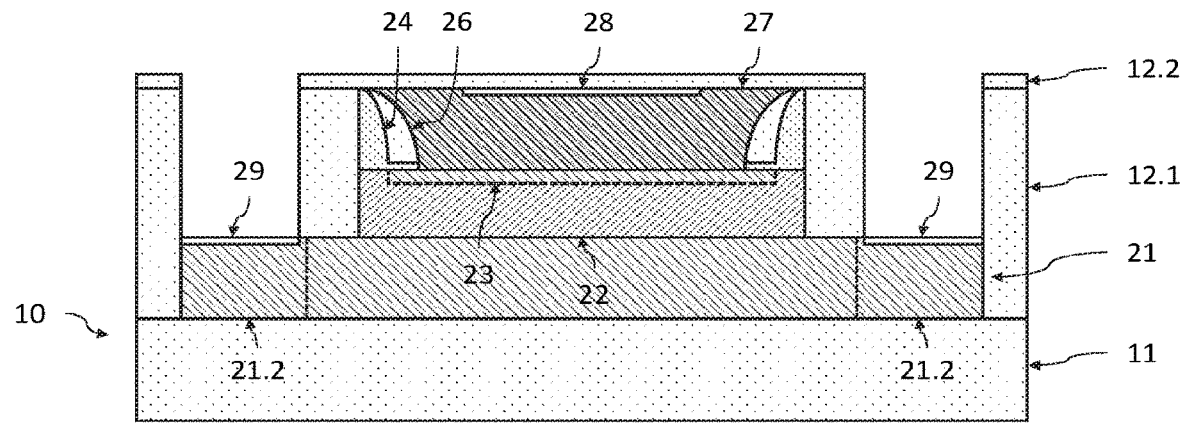

With reference to FIG. 2L, contact regions 29 of n++ doped silicon are advantageously formed in the lateral regions 21.2 of the contact portion 21. These contact regions 29 of n++ doped Si may be formed by siliciding, after having formed openings passing through the encapsulation oxide in such a manner as to liberate a surface area of the lateral regions 21.2 of the contact portion 21. This step may, as a variant, be carried out earlier in the fabrication process, for example prior to the formation of the multiplication portion 22. The contact regions 28, 29 (p++ doped Ge and n++ doped Si) allow the access resistance to be reduced.

Figure 2M:
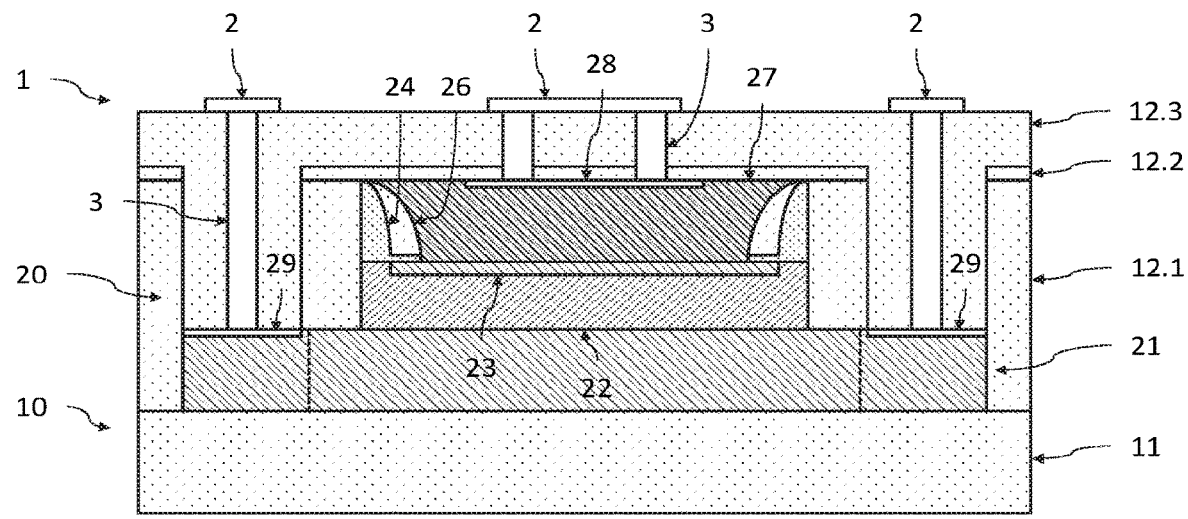
Figure 2N:
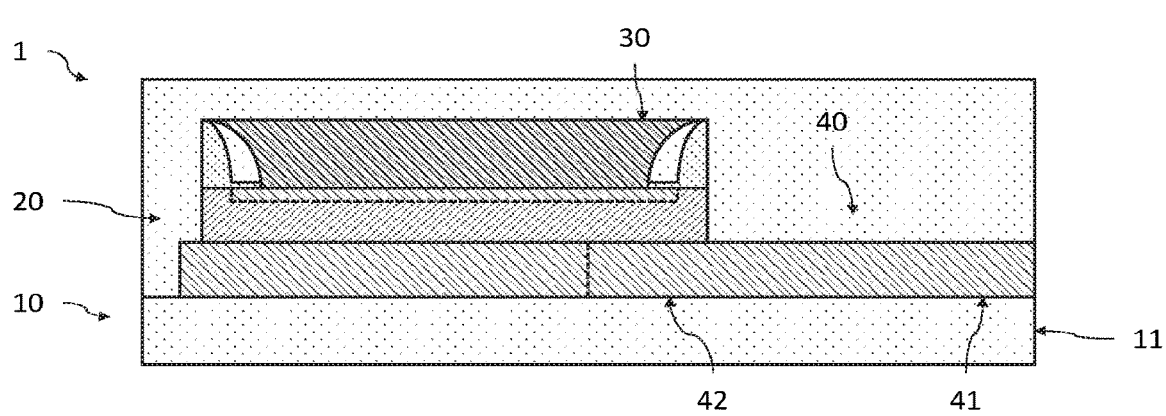

With reference to FIGS. 2M and 2N, a deposition is subsequently carried out of a second encapsulation layer 12.3 of an oxide identical or similar to that of the first encapsulation layer 12.1, in such a manner as to re-seal off the through-openings. Then, conducting vias 2, made of at least one electrically-conducting material, are formed through the encapsulation oxide, so as to come into contact with the contact region 28 of p++ doped Ge and the contact regions 29 of n++ doped Si. Electrical studs 3 are subsequently formed on the upper face of the encapsulation layer 12.3, in such a manner as to be in contact with the conducting vias 2.

Thus, by the fabrication method according to the invention, a photodiode 20 of the SACM-APD type is obtained in a mesa configuration and optically coupled to an integrated waveguide 40, whose absorption portion 27, charge region 23, and multiplication portion 22 are self-aligned, and whose various peripheral recessings are defined by the first and second spacers 24, 26, rather than by photolithographic steps. The optical and/or electronic properties of the photodiode 20 are therefore optimized, and the risks of breakdown at the edges of the photodiode 20 are, in particular, reduced. Furthermore, the method allows the drawbacks associated with the implementation of several successive photolithographic operations for defining the relative positioning of the multiplication portion 22, of the charge region 23 and of the absorption portion 27 to be avoided.

Particular embodiments have just been described. Numerous variants and modifications will be apparent to those skilled in the art. Thus, the types of conductivity may be reversed, and the levels of doping of the semiconductor materials may be modified.

The invention claimed is:

1. A method of fabrication of a photonic chip comprising at least one photodiode of the SACM-APD type lying on a carrier substrate, and a waveguide extending parallel to the carrier substrate and optically coupled to the photodiode, comprising the following steps:
   realizing a contact portion made of a first semiconductor material doped according to a first type of conductivity, starting from a layer of the first semiconductor material lying on an insulating layer of the carrier substrate;

depositing an encapsulation layer covering the contact portion, and realizing an opening through the encapsulation layer opening onto a surface of the contact portion;

realizing, in the through-opening, a multiplication portion made of the first semiconductor material starting from the surface of the contact portion, the multiplication portion having a thickness less than a height of the through-opening;

realizing a first spacer made of a first dielectric material, such that it covers the sides of the through-opening together with a peripheral part of constant width of a surface of the multiplication portion;

realizing a charge region in the multiplication portion and flush with an upper face of the latter, the charge region being bounded laterally by the first spacer such that it exhibits a constant peripheral recessing $dr_{zc}$ with respect to an edge of the multiplication portion;

realizing a second spacer made of a second dielectric material, distinct from the first dielectric material, such that it covers the first spacer together with a peripheral part of constant width of a surface of the charge region;

realizing an absorption portion made of a second semiconductor material, starting from a free surface of the charge region, the absorption portion being bounded laterally, at the interface with the charge region, by the second spacer such that its periphery is recessed by a constant amount $dr_{pa}$ with respect to an edge of the charge region.

2. The fabrication method as claimed in claim 1, in which the first dielectric material is adapted to be selectively etched with respect to the material of the encapsulation layer and to the first semiconductor material, and the second dielectric material is adapted to be selectively etched with respect to the first dielectric material.

3. The fabrication method as claimed in claim 2, the step for realizing the first spacer comprising:

a conformal deposition of a first spacer layer of the first dielectric material, in such a manner as to cover an upper face of the encapsulation layer, the sides of the through-opening and the surface of the multiplication portion, the thickness of the first spacer layer defining later on the value $dr_{zc}$ of the peripheral recessing of the charge region with respect to the multiplication portion;

an anisotropic etch of the first spacer layer, in such a manner as to liberate the upper face of the encapsulation layer together with a central part of a surface of the multiplication portion, and to only conserve a peripheral part forming said first spacer.

4. The fabrication method as claimed in claim 2, in which the step for realizing the second spacer comprises:

a conformal deposition of a thin protective layer for the first dielectric material, in such a manner as to cover the encapsulation layer, the first spacer, and the charge region;

a conformal deposition of a second spacer layer of the second dielectric material, in such a manner as to cover the thin protective layer, the thickness of the second spacer layer defining later on the value $dr_{pa}$ of the peripheral recessing of the absorption portion with respect to the charge region;

an anisotropic etch of the second spacer layer, in such a manner as to liberate a surface area of the thin protective layer situated on the upper face of the encapsulation layer together with a central part situated on the charge region, and to only conserve a peripheral part forming said second spacer;

an anisotropic etch of the thin protective layer, in such a manner as to liberate the upper face of the first encapsulation layer together with a central part of a surface of the charge region.

5. The fabrication method as claimed in claim 4, in which the charge region is formed between the conformal deposition of the thin protective layer and the conformal deposition of the second spacer layer, by ion implantation of dopants into the multiplication portion through the thin protective layer.

6. The fabrication method as claimed in claim 1, in which the step for forming the multiplication portion comprises an epitaxy of the second semiconductor material such that the epitaxied material spills out from the through-opening, followed by a step for chemical-mechanical planarization of the epitaxied material then by a partial etch of the epitaxied material, in such a manner as to form the multiplication portion.

7. The fabrication method as claimed in claim 1, in which the waveguide is formed starting from the layer of the first semiconductor material, and extends in a coplanar manner and contiguously with the contact portion.

8. The fabrication method as claimed in claim 1, comprising the following steps:

deposition of an additional encapsulation layer covering the absorption portion;

formation of conducting vias and of electrical studs, the electrical studs lying on the encapsulation layers, and the conducting vias connecting the contact portion and the absorption portion to the electrical studs.

9. A photonic chip comprising at least one photodiode of the SACM-APD type lying on a carrier substrate and a waveguide extending parallel to the carrier substrate and optically coupled to the photodiode, the photodiode comprising a stack composed of:

a contact portion made of a first semiconductor material doped according to a first type of conductivity, lying on an insulating layer of the carrier substrate;

an encapsulation layer, covering the contact portion and having a through-opening opening onto the contact portion;

a multiplication portion, lying on and in contact with the contact portion and situated in the through-opening;

a charge region, situated in the multiplication portion and flush with an upper face of the latter, and laterally bounded by a first spacer made of a first dielectric material extending in contact with the sides of the through-opening such that the charge region has a constant peripheral recessing $dr_{zc}$ with respect to an edge of the multiplication portion;

an absorption portion, lying on and in contact with the charge region, and situated in the through-opening, and laterally bounded, at the interface with the charge region, by a second spacer made of a second dielectric material distinct from the first dielectric material and extending between and in contact with the first spacer and with the absorption portion, such that the absorption portion has a constant peripheral recessing $dr_{pa}$ with respect to an edge of the charge region.

10. Photonic chip as claimed in claim 9, in which the absorption portion is formed using germanium, and the multiplication portion and the contact portion are made of silicon.

11. Photonic chip as claimed in claim 9, in which the first spacer is made of a silicon nitride, and the second spacer is made of a silicon oxide.

12. Photonic chip as claimed in claim 9, in which the waveguide is coplanar and formed contiguously with the contact portion.

13. Photonic chip as claimed in claim 9, in which the waveguide comprises a broadening region in which its width increases in the direction of the contact portion, and the photodiode comprises a coupling region formed by the multiplication portion, the charge region and the absorption portion, and situated facing the broadening region, whose width decreases in the direction of the waveguide.

* * * * *